(12) United States Patent
Pagaila et al.

(10) Patent No.: US 8,435,835 B2
(45) Date of Patent: May 7, 2013

(54) SEMICONDUCTOR DEVICE AND METHOD OF FORMING BASE LEADS FROM BASE SUBSTRATE AS STANDOFF FOR STACKING SEMICONDUCTOR DIE

(75) Inventors: Reza A. Pagaila, Singapore (SG); Dioscoro A. Merilo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 190 days.

(21) Appl. No.: 12/874,827

(22) Filed: Sep. 2, 2010

(65) Prior Publication Data
US 2012/0056314 A1 Mar. 8, 2012

(51) Int. Cl.
*H01L 23/50* (2006.01)
(52) U.S. Cl.
USPC .......... 438/107; 257/777; 257/E23.079; 257/E21.705; 438/108; 438/126; 438/127; 438/110
(58) Field of Classification Search .......... 438/107, 438/108, 109, 110, 126, 127; 257/686, 777, 257/E23.079, E21.705, 734
See application file for complete search history.

(56) References Cited

U.S. PATENT DOCUMENTS

| | | | |
|---|---|---|---|
| 5,656,550 A * | 8/1997 | Tsuji et al. | 438/123 |
| 7,342,318 B2 | 3/2008 | Huang et al. | |
| 7,602,053 B2 | 10/2009 | Huang et al. | |
| 2003/0170450 A1 * | 9/2003 | Stewart et al. | 428/343 |
| 2009/0001543 A1 * | 1/2009 | Chung | 257/686 |

* cited by examiner

*Primary Examiner* — S. V. Clark
*Assistant Examiner* — Krista Soderholm
(74) *Attorney, Agent, or Firm* — Robert D. Atkins; Patent Law Group: Atkins & Associates, P.C.

(57) ABSTRACT

A semiconductor device has a base substrate with first and second opposing surfaces. A first etch-resistant conductive layer is formed over the first surface of the base substrate. A second etch-resistant conductive layer is formed over the second surface of the base substrate. A first semiconductor die has bumps formed over contact pads on an active surface of the first die. The first die is mounted over a first surface of the first conductive layer. An encapsulant is deposited over the first die and base substrate. A portion of the base substrate is removed to form electrically isolated base leads between opposing portions of the first and second conductive layers. A second semiconductor die is mounted over the encapsulant and a second surface of the first conductive layer between the base leads. A height of the base leads is greater than a thickness of the second die.

16 Claims, 7 Drawing Sheets

SEMICONDUCTOR DEVICE AND METHOD OF FORMING BASE LEADS FROM BASE SUBSTRATE AS STANDOFF FOR STACKING SEMICONDUCTOR DIE

FIELD OF THE INVENTION

The present invention relates in general to semiconductor devices and, more particularly, to a semiconductor device and method of forming a plurality of base leads from a base substrate as a standoff for stacking semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices are often stacked for efficient integration. The electrical interconnection between semiconductor devices, such as wafer level chip scale package (WLCSP) containing semiconductor die, on multiple levels (3-D device integration) and external devices can be accomplished with conductive through silicon vias (TSV), through hole vias (THV), Cu-plated conductive pillars, and conductive bumps. These vertical interconnect structures are costly and time consuming during the manufacturing process, and susceptible to high stress, cracking, collapse, and other defects during formation.

SUMMARY OF THE INVENTION

A need exists to provide simple and cost-effective vertical interconnect structure for stackable semiconductor devices. Accordingly, in one embodiment, the present invention is a method of making a semiconductor device comprising the steps of providing a base substrate having first and second opposing surfaces, forming a first etch-resistant conductive layer over the first surface of the base substrate, forming a second etch-resistant conductive layer over the second surface of the base substrate, providing a first semiconductor die having a plurality of bumps formed over contact pads on an active surface of the first semiconductor die, mounting the first semiconductor die to the base substrate with the bumps bonded to a first surface of the first etch-resistant conductive layer, depositing an encapsulant over the first semiconductor die and base substrate, removing a portion of the base substrate to form electrically isolated base leads between opposing portions of the first etch-resistant conductive layer and second etch-resistant conductive layer, and mounting a second semiconductor die to the encapsulant and a second surface of the first etch-resistant conductive layer between the base leads.

In another embodiment, the present invention is a method of making a semiconductor device comprising the steps of providing a base substrate having first and second opposing surfaces, forming a first conductive layer over the first surface of the base substrate, forming a second conductive layer over the second surface of the base substrate, mounting a first semiconductor die to the first conductive layer over the base substrate, depositing an encapsulant over the first semiconductor die and base substrate, removing a portion of the base substrate to form electrically isolated base leads between opposing portions of the first conductive layer and second conductive layer, and mounting a second semiconductor die to the encapsulant and first conductive layer between the base leads.

In another embodiment, the present invention is a method of making a semiconductor device comprising the steps of providing a base substrate having first and second opposing surfaces, forming a first conductive layer over the first surface of the base substrate, forming a second conductive layer over the second surface of the base substrate, mounting a first semiconductor die to the first conductive layer over the base substrate, depositing an encapsulant over the first semiconductor die and base substrate, and removing a portion of the base substrate to form electrically isolated base leads between the first conductive layer and second conductive layer.

In another embodiment, the present invention is a semiconductor device comprising a base substrate having first and second opposing surfaces. A first conductive layer is formed over the first surface of the base substrate. A second conductive layer is formed over the second surface of the base substrate. A first semiconductor die is mounted over the first conductive layer. An encapsulant is deposited over the first semiconductor die and base substrate. A portion of the base substrate is removed to form electrically isolated base leads between opposing portions of the first conductive layer and second conductive layer. A second semiconductor die is mounted over the encapsulant and first conductive layer between the base leads.

DETAILED DESCRIPTION OF THE DRAWINGS

Figure 1:
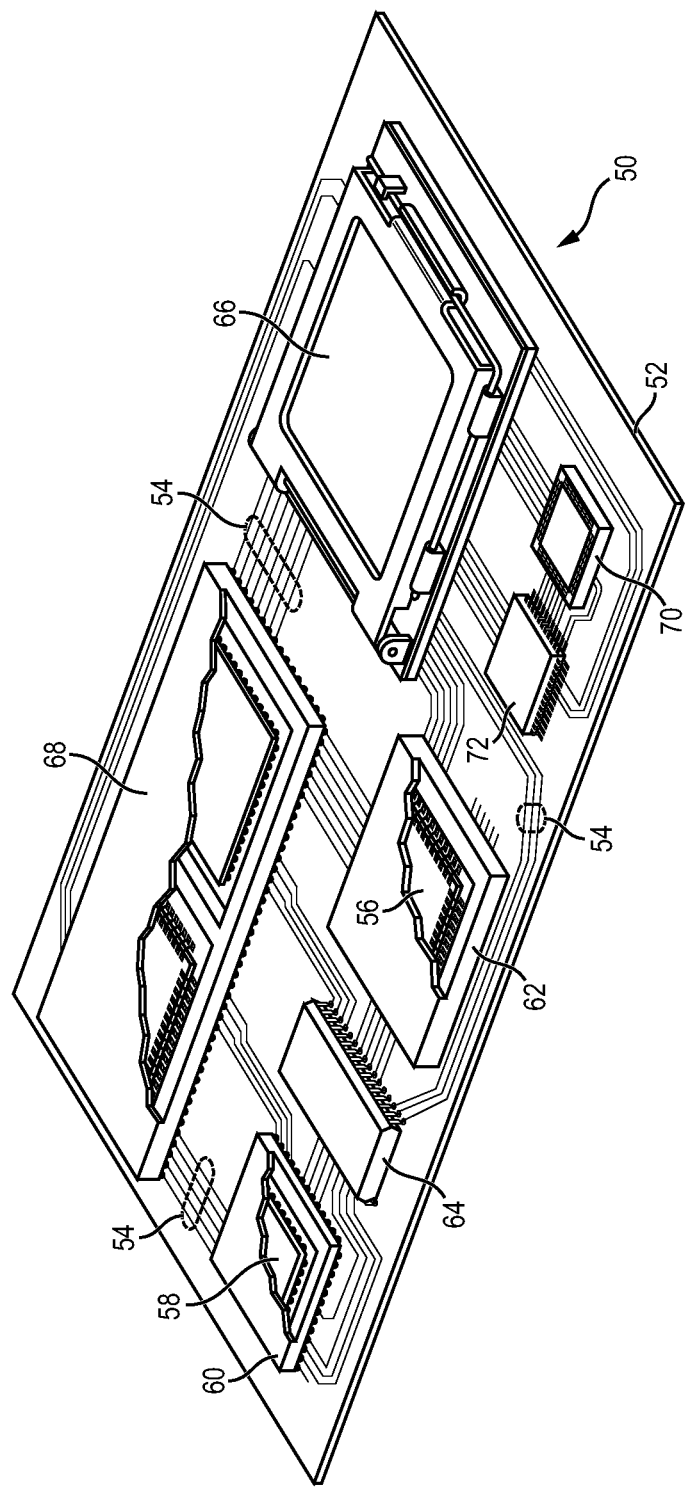
FIG. 1 illustrates a PCB with different types of packages mounted over its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted over a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
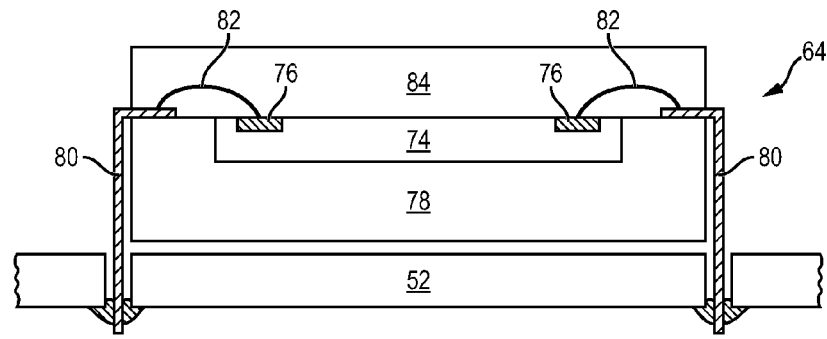
FIGS. 2a-2c illustrate further detail of the semiconductor packages mounted over the PCB.
Figure 2B:
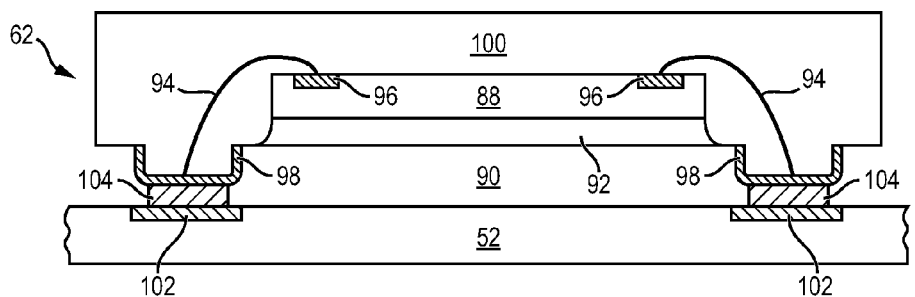
Figure 2C:
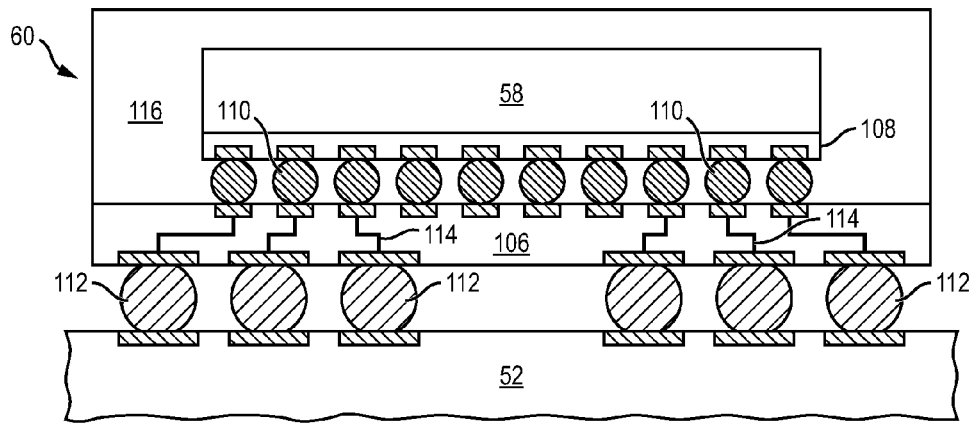

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted over an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
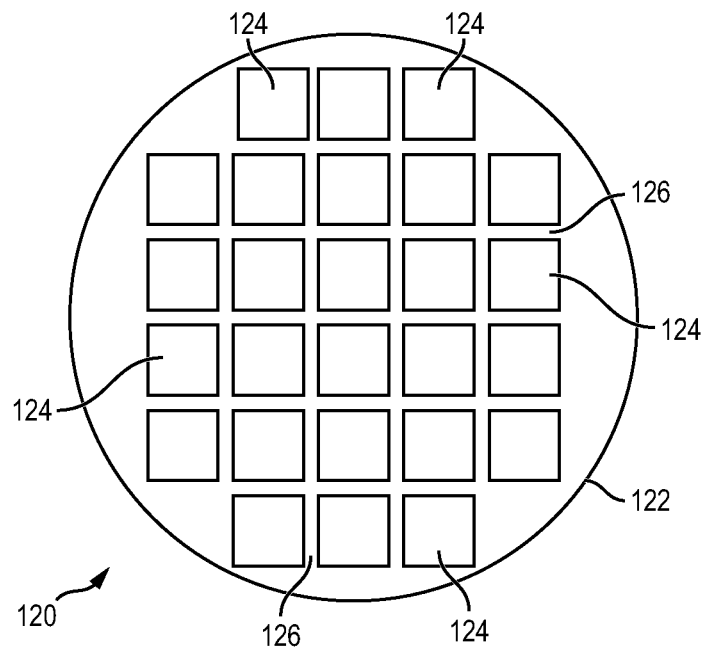
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

Figure 3B:
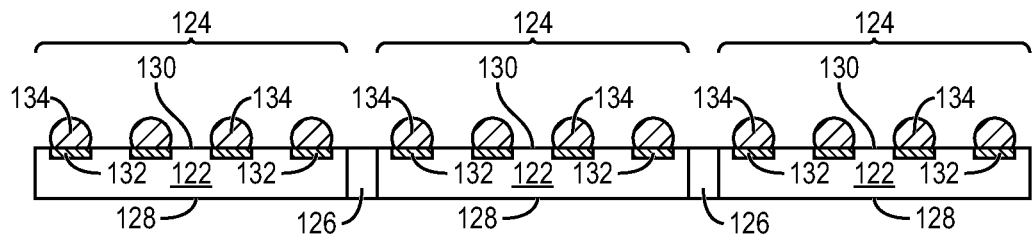

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132. In one embodiment, semiconductor die 124 is a flipchip type semiconductor die.

Figure 3C:
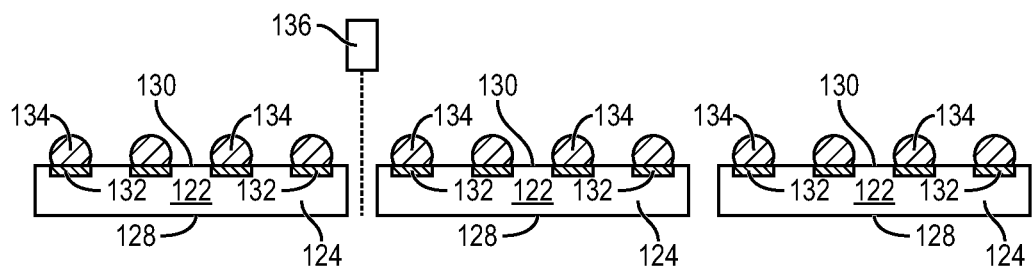

In FIG. 3c, semiconductor wafer 120 is singulated through saw street 126 using saw blade or laser cutting tool 136 into individual semiconductor die 124. Each semiconductor die 124 has bumps 134 formed over contact pads 132.

Figure 4A:
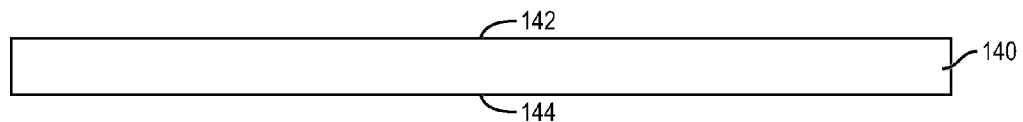
FIGS. 4a-4j illustrate a process of forming a plurality of base leads from a base substrate as a standoff for stacking semiconductor die.

FIGS. 4a-4j illustrate, in relation to FIGS. 1 and 2a-2c, a process of forming a plurality of base leads from a base substrate as a standoff for stacking semiconductor die. FIG. 4a shows a wafer-level base substrate or leadframe 140 containing Cu, Cu alloys, Al, or other suitable conductive material. Base substrate 140 has surface 142 and opposite surface 144. Wafer-level base substrate 140 has sufficient area to process multiple semiconductor die, as described below.

Figure 4B:
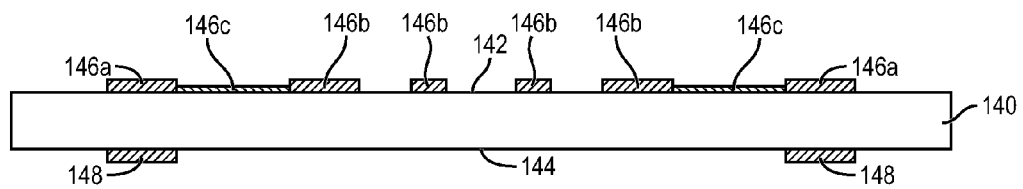

In FIG. 4b, an electrically conductive layer 146 is formed over surface 142 of base substrate 140 and an electrically conductive layer 148 is formed over surface 144 of base substrate 140 using patterning and an electrolytic plating or electroless plating process. Conductive layers 146 and 148 can be one or more layers of Al, Cu, Sn, Ni, Au, Ag, or other suitable electrically conductive material. In one embodiment, conductive layers 146 and 148 each contain Au, Ag, or other etch-resistant material on a preplated leadframe (Ag/PPF plating). Conductive layers 146 and 148 operate as contact pads for later mounted semiconductor die or interconnect structures, such as bumps.

Figure 4C:
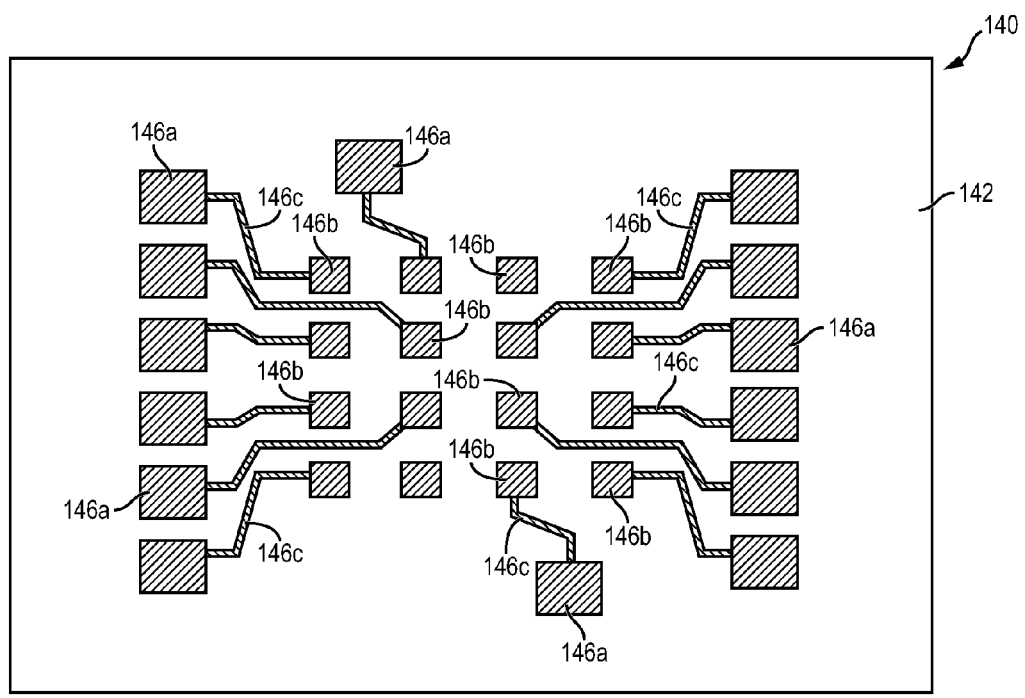
Figure 4D:
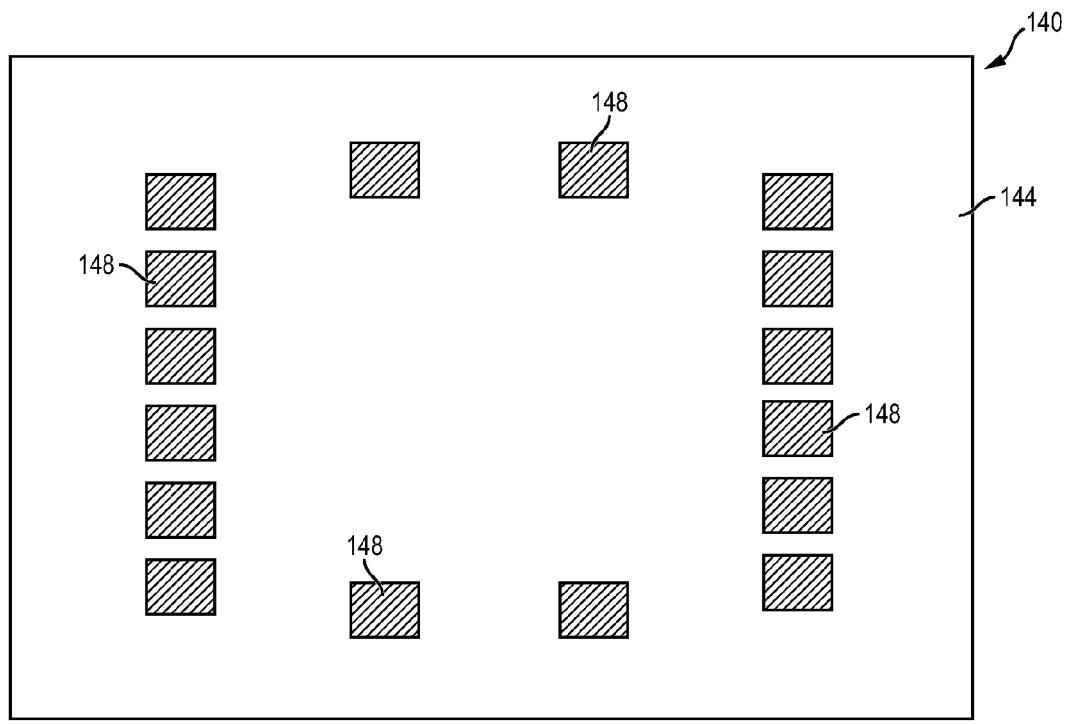

FIG. 4c shows a plan view of conductive layer 146 as formed over surface 142 of base substrate 140. Conductive layer 146 includes contact pads 146a, contact pads 146b, and redistribution layer (RDL) 146c. Contact pads 146a, RDL 146c, and contact pads 146b are electrically continuous over surface 142 of base substrate 140. An RDL can also be formed on active surface 130 of semiconductor die 124. Some contact pads 146b have no corresponding RDL. FIG. 4d shows a plan view of conductive layer 148 as formed over surface 144 of base substrate 140. Conductive layer 148 includes contact pads formed on surface 144 of base substrate 140 directly opposite contact pads 146a on surface 142.

Figure 4E:
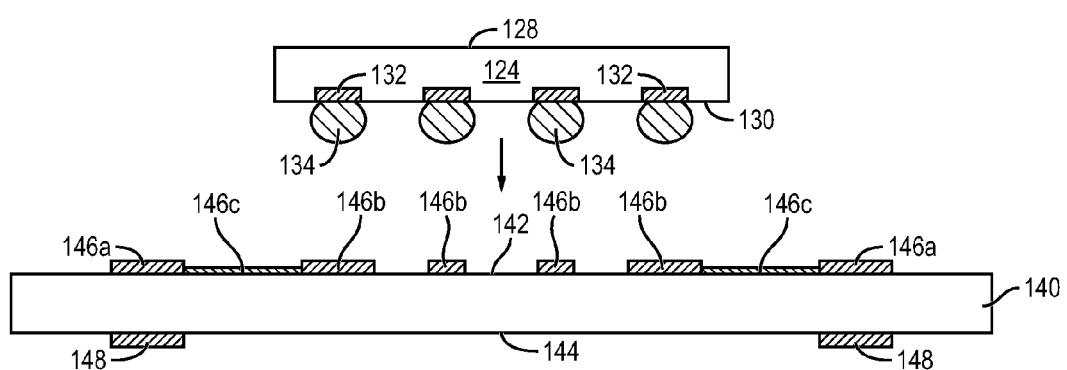
Figure 4F:
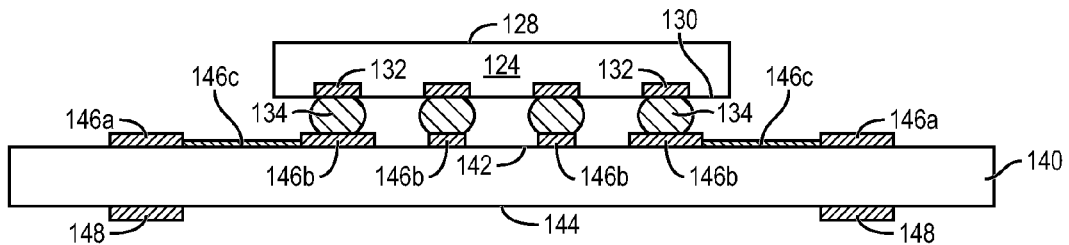

In FIGS. 4e-4f, semiconductor die 124 from FIGS. 3a-3c are positioned over and mounted to conductive layer 146 over surface 142 of base substrate 140 using a pick and place operation. More specifically, bumps 134 are metallurgically and electrically connected to certain portions of conductive layer 146, i.e., contact pads 146b, depending on the electrical function of semiconductor die 124.

Figure 4G:
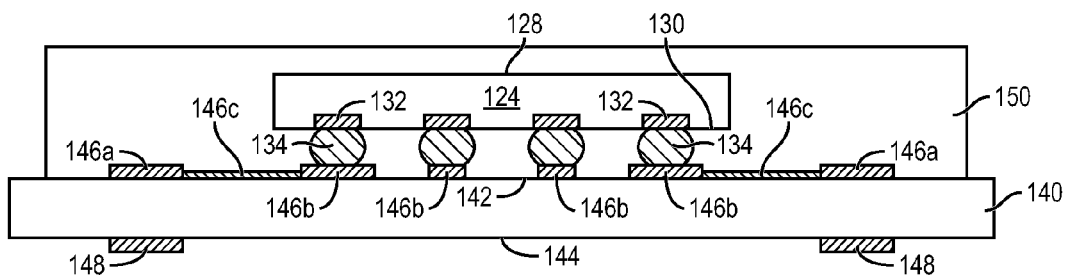

In FIG. 4g, an encapsulant or molding compound 150 is deposited over semiconductor die 124 and base substrate 140 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. In one embodiment, encapsulant 150 is deposited as a mold underfill (MUF) covering base substrate 140 and a top and side surface of semiconductor die 124, as well as the area between the semiconductor die and base substrate. The MUF can use a side injection with opposite side vacuum assisted draw molding apparatus to completely fill the area between semiconductor die 124 and base substrate 140. Encapsulant 150 is non-conductive and environmentally protects the semiconductor device from external elements and contaminants.

Figure 4H:
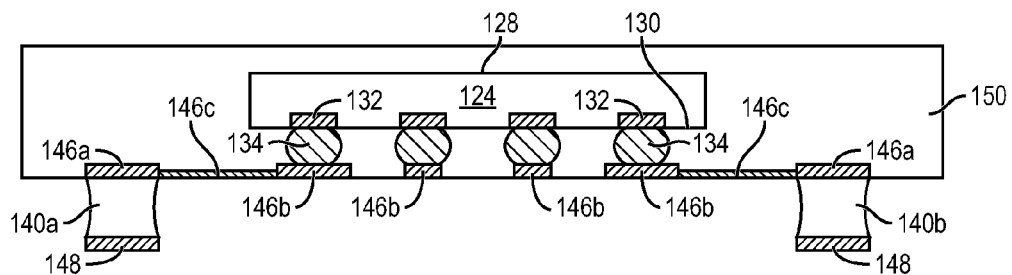

In FIG. 4h, a portion of base substrate 140 is removed by an etching process to form electrically isolated base leads 140a-140b between opposing conductive layers 146a and 148. The Ag/PPF plating nature of conductive layers 146 and 148 is resistant to the etching process. The etchant reacts more aggressively in removing material within base substrate 140 than with conductive layers 146 and 148. Consequently, a central portion base substrate 140, i.e., under conductive layer 146b and 146c, is removed because there is no opposing conductive layer 148. The central portion of base substrate 140 is reserved as an area for a subsequently stacked semiconductor die. The portion of base substrate 140 between opposing etch-resistant conductive layers 146a and 148 remains as electrically isolated base leads 140a-140b for z-direction vertical interconnect. Conductive layer 146b and 146c also remain partially embedded and exposed from encapsulant 150 after the etching process.

Figure 4I:
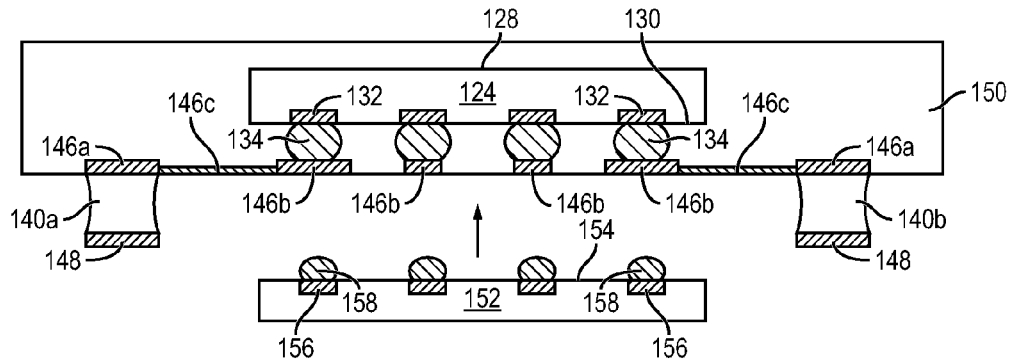

FIG. 4i shows a semiconductor die 152 with active surface 154 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 154 to implement analog circuits or digital circuits, such as DSP, ASIC, memory, or other signal processing circuit. Semiconductor die 152 may also contain IPDs, such as inductors, capacitors, and resistors, for RF signal processing. In one embodiment, semiconductor die 152 is a flipchip type semiconductor die. Contact pads 156 are formed on active surface 154 and electrically connected to the circuits on the active surface. A plurality of bumps 158 is formed over contact pads 156. Semiconductor die 152 is a tested known good unit (KGU).

Figure 4J:
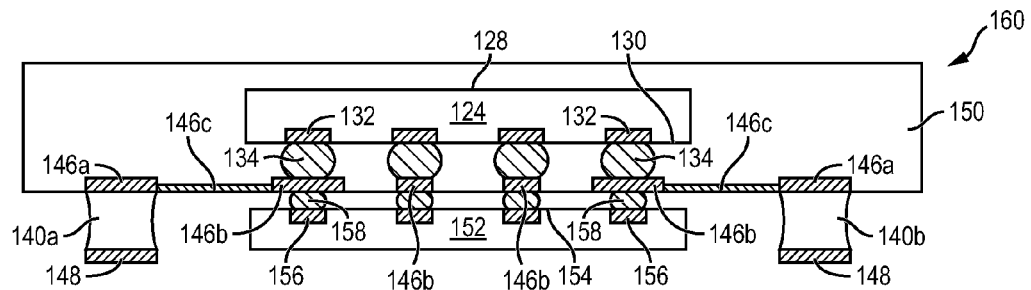

Semiconductor die 152 is mounted over conductive layer 146b, as show in FIG. 4j. More specifically, bumps 158 are metallurgically and electrically connected to conductive layer 146b. Some bumps 158 are electrically connected to portions of conductive layer 146b common to bumps 134. Base leads 140a-140b provide vertical electrical connection for semiconductor die 124 and 152, as well as a vertical standoff or headroom for clearance of semiconductor die 152 as the height of base leads 140a-140b is greater than a thickness of semiconductor die 152 and bumps 158. In another embodiment, a discrete semiconductor component or semiconductor package can be mounted over conductive layer 146b.

Wafer-level base substrate 140 is singulated through encapsulant 150 using saw blade or laser cutting tool to separate the semiconductor die and provide individual embedded wafer-level ball grid array (eWLB), wafer level chip scale package (WLCSP), and quad flat pack no-load (QFN) semiconductor packages 160 for further integration. Within semiconductor package 160, semiconductor die 124 is electrically connected to base leads 140a-140b and conductive layers 146 and 148. That is, bumps 134 are bonded to one side of contact pads 146b. Semiconductor die 152 is electrically connected to an opposite side of contact pads 146b. Accordingly, some contact pads 146b are common to bumps 134 and bumps 158. Other contact pads 146b can be electrically connected to either bumps 134 on one side of the contact pad or bumps 158 on the other side of the contact pad. For those contact pads 146b common to both bumps 134 and bumps 158, the electrical path between semiconductor die 124 and 152 is short, which enhances electrical performance. Conductive layers 146 and 148 contain etch resistant material, so the etching process to remove base substrate 140 leaves behind electrically isolated base leads 140a-140b. Base leads 140a-140b provide vertical electrical connection for semiconductor die 124 and 152, as well as a vertical standoff or headroom for clearance of semiconductor die 152 as the height of base leads 140a-140b is greater than a thickness of semiconductor die 152 and bumps 158. Base leads 140a-140b also serve as heat dissipation paths for semiconductor die 124 and 152. The vertical interconnection of semiconductor die 124 and 152 can be achieved in a cost effective manner.

Figure 5:
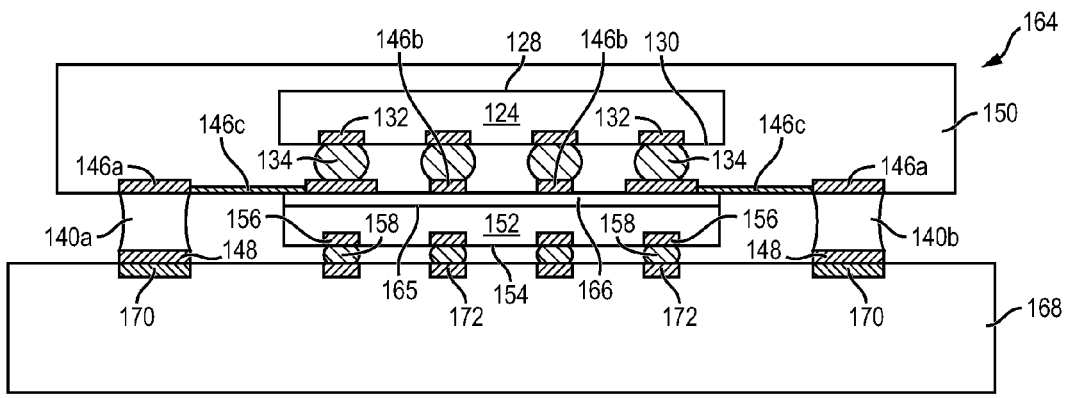
FIG. 5 illustrates a semiconductor package having base leads formed from a base substrate as a standoff for stacking semiconductor die mounted over a PCB.

FIG. 5 shows another embodiment of semiconductor package 164, similar to FIGS. 4a-4j, with semiconductor die 152 mounted back surface 165 to encapsulant 150 and conductive layer 146b and 146c with die attach adhesive 166. Semiconductor package 164 is mounted over PCB 168. Conductive layer 148 is electrically connected through base leads 140a-140b to contact pads 170 formed over PCB 168. Bumps 158 are electrically connected to contact pads 172 formed over PCB 168.

Figure 6:
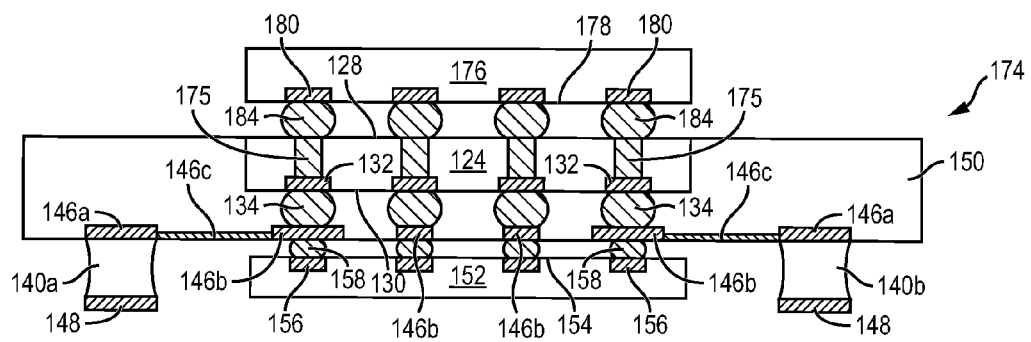
FIG. 6 illustrates a semiconductor die mounted over a semiconductor package having base leads formed from a base substrate as a standoff for stacking semiconductor die.

FIG. 6 shows another embodiment of semiconductor package 174, similar to FIGS. 4a-4j, with a plurality of vias formed through semiconductor die 124 while in wafer form, see FIGS. 3a-3c, using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical conductive through silicon vias (TSV) 175. Encapsulant 150 is planarized with a grinder down to back surface 128 of semiconductor die 124 to expose conductive TSV 175.

A semiconductor die 176 has active surface 178 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 178 to implement analog circuits or digital circuits, such as DSP, ASIC, memory, or other signal processing circuit. Semiconductor die 176 may also contain IPDs, such as inductors, capacitors, and resistors, for RF signal processing. In one embodiment, semiconductor die 176 is a flipchip type semiconductor die. Contact pads 180 are formed on active surface 178 and electrically connected to the circuits on the active surface. A plurality of bumps 184 is formed over contact pads 180. Semiconductor die 176 is stacked over semiconductor die 124 with bumps 184 electrically connected to conductive TSV 175.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a base substrate including first and second opposing surfaces;
   forming a first etch-resistant conductive layer over the first surface of the base substrate;
   forming a second etch-resistant conductive layer over the second surface of the base substrate;
   providing a first semiconductor die including a plurality of bumps formed over contact pads on an active surface of the first semiconductor die;
   disposing the first semiconductor die on the base substrate with the bumps bonded to a first surface of the first etch-resistant conductive layer;
   depositing an encapsulant over the first semiconductor die and base substrate;
   removing a portion of the base substrate to form electrically isolated base leads between opposing portions of the first etch-resistant conductive layer and second etch-resistant conductive layer; and
   disposing a second semiconductor die on the encapsulant and a second surface of the first etch-resistant conductive layer between the base leads.

2. The method of claim 1, wherein a height of the base leads is greater than a thickness of the second semiconductor die.

3. The method of claim 1, further including disposing a third semiconductor die over the first semiconductor die.

4. The method of claim 1, wherein the first etch-resistant conductive layer includes a first contact pad, redistribution layer, and second contact pad.

5. The method of claim 1, further including depositing the encapsulant using a mold underfill process.

6. A method of making a semiconductor device, comprising:
   providing a base substrate including first and second opposing surfaces;
   forming a first conductive layer over the first surface of the base substrate;
   forming a second conductive layer over the second surface of the base substrate;
   disposing a first semiconductor die on the first conductive layer over the base substrate;
   depositing an encapsulant over the first semiconductor die and base substrate;
   removing a portion of the base substrate to form electrically isolated base leads between opposing portions of the first conductive layer and second conductive layer; and
   disposing a second semiconductor die on the encapsulant and first conductive layer between the base leads.

7. The method of claim 6, wherein the first conductive layer includes an etch-resistant material.

8. The method of claim 6, wherein the second conductive layer includes an etch-resistant material.

9. The method of claim 6, wherein a height of the base leads is greater than a thickness of the second semiconductor die.

10. The method of claim 6, wherein the first semiconductor die and second semiconductor die are electrically connected to opposite sides of a portion of the first conductive layer.

11. The method of claim 6, further including disposing a third semiconductor die over the first semiconductor die.

12. The method of claim 6, further including:
   forming a plurality of conductive vias through the first semiconductor die; and
   disposing a third semiconductor die over the first semiconductor die electrically connected to the conductive vias.

13. The method of claim 6, further including depositing the encapsulant using a mold underfill process.

14. A method of making a semiconductor device, comprising:
   providing a base substrate including first and second opposing surfaces;
   forming a first conductive layer over the first surface of the base substrate;

forming a second conductive layer over the second surface of the base substrate;

disposing a first semiconductor die on the first conductive layer over the base substrate;

depositing an encapsulant over the first semiconductor die and base substrate;

removing a portion of the base substrate to form electrically isolated base leads between the first conductive layer and second conductive layer; and disposing a second semiconductor die on the encapsulant and first conductive layer between the base leads.

15. The method of claim 14, wherein the first semiconductor die and second semiconductor die are electrically connected to opposite sides of a portion of the first conductive layer.

16. The method of claim 14, wherein a height of the base leads is greater than a thickness of the second semiconductor die.

\* \* \* \* \*